United States Patent
Zhou et al.

(10) Patent No.: US 12,024,639 B2
(45) Date of Patent: Jul. 2, 2024

(54) HIGH-PERFORMANCE REPAIR TAPE FOR BACKBOARD OF PHOTOVOLTAIC MODULE, AND MANUFACTURING METHOD THEREFOR

(71) Applicant: CYBRID TECHNOLOGIES INC., Jiangsu (CN)

(72) Inventors: Qiquan Zhou, Jiangsu (CN); Hongye Chen, Jiangsu (CN); Keiichi Uno, Jiangsu (CN); Xiaoping Wu, Jiangsu (CN)

(73) Assignee: CYBRID TECHNOLOGIES INC. (CN)

( * ) Notice: Subject to any disclaimer, the term of this patent is extended or adjusted under 35 U.S.C. 154(b) by 737 days.

(21) Appl. No.: 16/495,962

(22) PCT Filed: Sep. 1, 2017

(86) PCT No.: PCT/CN2017/100236
§ 371 (c)(1),
(2) Date: Sep. 20, 2019

(87) PCT Pub. No.: WO2019/024166
PCT Pub. Date: Feb. 7, 2019

(65) Prior Publication Data
US 2020/0024489 A1  Jan. 23, 2020

(30) Foreign Application Priority Data
Aug. 3, 2017 (CN) .......................... 201710656529.2

(51) Int. Cl.
*C09J 11/08* (2006.01)
*C08F 220/18* (2006.01)
(Continued)

(52) U.S. Cl.
CPC .... *C09D 133/066* (2013.01); *C08F 220/1804* (2020.02); *C08J 7/0427* (2020.01);
(Continued)

(58) Field of Classification Search
None
See application file for complete search history.

(56) References Cited

U.S. PATENT DOCUMENTS

| 4,687,794 A | * | 8/1987 | Huddleston | ........... B29C 48/468 |
| | | | | 524/270 |
| 2011/0105637 A1 | * | 5/2011 | Fujita | ..................... C09J 123/22 |
| | | | | 257/E23.116 |

(Continued)

FOREIGN PATENT DOCUMENTS

| CN | 101123278 A | 2/2008 |
| CN | 101645465 A | 2/2010 |

(Continued)

OTHER PUBLICATIONS

Machine translation of CN205680696U. (Year: 2016).*

(Continued)

*Primary Examiner* — Scott R. Walshon
*Assistant Examiner* — Thomas A Mangohig
(74) *Attorney, Agent, or Firm* — BARNES & THORNBURG LLP; Jeffrey R. Stone (57) ABSTRACT

Disclosed is a high-performance repair tape for a backboard of a photovoltaic module. The tape comprises a base material layer, a functional adhesive layer, and a release material layer provided in sequence from top to bottom; the base material layer is formed of a polyester thin film material; the functional adhesive layer is formed of a high weather-resistance adhesive. According to the high-performance repair tape for a backboard of a photovoltaic module, and a manufacturing method therefor provided by the present (Continued)

invention, by selecting a weather-resistant base material layer, effects, such as water resisting, insulation, and ultraviolet radiation resistance, can be achieved, and a backboard independence effect is achieved; by selecting a weather-resistant adhesive for the functional adhesive layer, the weather resistance, high temperature resistance, and yellowing resistance of the tape can be improved; the tape has a strong bonding strength and is not easy to peel off, and the tape is easy to fit and facilitates construction.

2 Claims, 1 Drawing Sheet (51) Int. Cl.
| | |
|---|---|
| C08J 7/04 | (2020.01) |
| C08J 7/043 | (2020.01) |
| C09D 7/61 | (2018.01) |
| C09D 7/63 | (2018.01) |
| C09D 127/18 | (2006.01) |
| C09D 133/06 | (2006.01) |
| C09D 183/08 | (2006.01) |
| C09J 7/24 | (2018.01) |
| C09J 7/25 | (2018.01) |
| C09J 7/38 | (2018.01) |
| C09J 11/04 | (2006.01) |
| C09J 11/06 | (2006.01) |
| C09J 107/00 | (2006.01) |
| C09J 123/22 | (2006.01) |
| C09J 133/08 | (2006.01) |
| C09J 175/04 | (2006.01) |
| H01L 31/18 | (2006.01) |

(52) U.S. Cl.
CPC ........... *C08J 7/043* (2020.01); *C09D 7/61* (2018.01); *C09D 7/63* (2018.01); *C09D 127/18* (2013.01); *C09D 183/08* (2013.01); *C09J 7/243* (2018.01); *C09J 7/255* (2018.01); *C09J 7/38* (2018.01); *C09J 11/04* (2013.01); *C09J 11/06* (2013.01); *C09J 11/08* (2013.01); *C09J 107/00* (2013.01); *C09J 123/22* (2013.01); *C09J 133/08* (2013.01); *C09J 175/04* (2013.01); *H01L 31/186* (2013.01); *C08F 220/1808* (2020.02); *C08J 2323/06* (2013.01); *C08J 2323/12* (2013.01); *C08J 2367/00* (2013.01); *C08J 2377/00* (2013.01); *C09J 2203/322* (2013.01); *C09J 2301/122* (2020.08); *C09J 2301/16* (2020.08); *C09J 2301/302* (2020.08); *C09J 2301/312* (2020.08); *C09J 2301/408* (2020.08); *C09J 2423/006* (2013.01); *C09J 2423/046* (2013.01); *C09J 2423/106* (2013.01); *C09J 2427/006* (2013.01); *C09J 2433/00* (2013.01); *C09J 2467/006* (2013.01); *C09J 2477/006* (2013.01)

(56) References Cited

U.S. PATENT DOCUMENTS

| | | |
|---|---|---|
| 2014/0034109 A1 | 2/2014 | Kim et al. |
| 2017/0247582 A1* | 8/2017 | Keite-Telgenbüscher ................... C09J 11/08 |

FOREIGN PATENT DOCUMENTS

| | | | |
|---|---|---|---|
| CN | 102315285 | 1/2012 | |
| CN | 102382595 | 3/2012 | |
| CN | 103059676 A | 4/2013 | |
| CN | 104538473 | 4/2015 | |
| CN | 105754506 | 7/2016 | |
| CN | 205680696 | 11/2016 | |
| CN | 205680696 U | 11/2016 | |
| CN | 106590459 | 4/2017 | |
| CN | 106893510 | 6/2017 | |
| JP | 2015195338 A | 11/2015 | |
| WO | 2006/088255 | 8/2006 | |
| WO | 2015/151221 A1 | 10/2015 | |
| WO | WO-2016066434 A1 * | 5/2016 | ............ C08F 287/00 |

OTHER PUBLICATIONS

International Search Report issued in PCT application No. PCT/CN2017/100236, dated Apr. 18, 2018.
European Search Report issued in application No. 17920406.0, dated Jul. 30, 2021.

* cited by examiner

HIGH-PERFORMANCE REPAIR TAPE FOR BACKBOARD OF PHOTOVOLTAIC MODULE, AND MANUFACTURING METHOD THEREFOR

TECHNICAL FIELD

The present invention relates to the technical field of adhesive tapes, in particular to a high-performance repair tape for a backboard of a photovoltaic module, and a manufacturing method thereof.

BACKGROUND

Solar backboard is located on the back face of a solar panel, plays a role in protecting and supporting the cells in the module, and has robust insulation and water resistance. However, after the backboard of a solar module is used outdoors for a period of time, the backboard will suffer from gradual aging and cracking phenomena such as yellowing, pinholes, chalking, micro-cracking and cracking, and therefore cannot meet the safety requirement of the module during operation; meanwhile, during the transportation and installation of the solar module, part of the backboard of the module will be damaged and scratched, and safety failure and function failure can also be caused upon the operation of the module.

Up to now, suitable repairing methods intended for the damaged part of the solar backboard have not been found, only the method of replacing the damaged module as a whole can be used, which method can only achieve the replacement of a small number of modules and results in extremely high cost for replacement in a large batch, and the used modules are difficult to recover and also prone to causing environmental pollution. In view of this background, it is of great significance to develop a repair tape, which can be applied on site, is environmentally friendly and waste-free, has low cost, and is enable of normal operation of damaged modules in the guarantee period.

SUMMARY

In view of the drawbacks in the existing art, the object of the present invention is to provide a high-performance repair tape for a backboard of a photovoltaic module, and a manufacturing method thereof.

To achieve this purpose, the present invention adopts the following technical solutions:

a high-performance repair tape for a backboard of a photovoltaic module, comprising a base material layer, a functional adhesive layer, and a release material layer provided in sequence from top to bottom, with the base material layer being made up of a polyester thin film material, and the functional adhesive layer being made up of a high weather-resistance adhesive.

Further, the base material layer is any one selected from the group consisting of a composite polyester film, a coated polyester film or a polymer co-extruded resin film.

Further, the composite polyester film comprises a core layer in the middle and weather-resistant polymer films adhered to the two sides of the core layer, alternatively comprises a core layer in the middle, a weather-resistant polymer film adhered to one side of the core layer and a polymer weather-resistant coating layer directly coated on the other side of the core layer, wherein both the weather-resistant polymer film and the polymer weather-resistant coating layer have the functions of ultraviolet resistance, damp heat resistance and ultraviolet blocking.

Further, the core layer is any one selected from the group consisting of a polyester film, a nylon film, a high-barrier film, a polypropylene film and a polyethylene film; the weather-resistant polymer film is one or more selected from the group consisting of a fluorine film, an ultraviolet-resistant polyester film, an ultraviolet-resistant polyolefin film and an ultraviolet-resistant polyamide film; the fluorine film is any one selected from the group consisting of polyvinyl fluoride, polyvinylidene fluoride, ethylene-tetrafluoroethylene copolymer, polychlorotrifluoroethylene, polytetrafluoroethylene or ethylene-chlorotrifluoroethylene copolymer; the polymer weather-resistant coating layer is formed from one or more selected from the group consisting of a fluorocarbon resin, an acrylic resin, a polyester resin, a polyamide resin, a polyurethane resin or an epoxy resin by curing with a curing agent or directly curtain coating on a surface of the core layer.

Further, the coated polyester film comprises a core layer positioned in the middle and a coating layer directly coated on one side or two sides of the core layer; the core layer is any one selected from the group consisting of a polyester film, a nylon film, a high-barrier film, a polypropylene film and a polyethylene film; the coating layer comprises an organic resin, a curing agent and an inorganic filler, wherein the organic resin is one or more selected from the group consisting of a fluoro-silicone resin, a polyvinylene difluoride fluorocarbon resin, a polytetrafluoroethylene fluorocarbon resin, a perfluorinated resin, a fluorine-containing acrylic resin, a reactive fluorocarbon resin, a polyester resin, a polyamide resin, a polyurethane resin and an epoxy resin; the curing agent is one or more selected from the group consisting of an isocyanate curing agent, an imidazole curing agent, a dicyandiamide curing agent, an acylhydrazine curing agent, an amine curing agent, an anhydride curing agent and a cationic curing agent; the inorganic filler is one or more selected from the group consisting of titanium white powder, mica powder, aluminum oxide, silicon dioxide, barium sulfate, pumice powder, calcium carbonate, aluminum hydroxide, carbon black, talcum powder, diatomite and diamond powder.

Further, the polymer co-extruded resin film is a multilayer co-extruded film made up of modified polyolefin materials, wherein the modified polyolefin materials are obtained by blending or dynamically crosslinking a polyolefin with a macromolecule graft copolymer containing an amide group, an epoxy group, a maleic anhydride group or a polyether group, and simultaneously adding a filler for modification so as to enhance tensile-failure resistance, water resistance, easy adhesion and light reflection; the filler is one or more selected from the group consisting of diatomite, aluminum oxide, aluminum hydroxide, titanium white powder, mica powder, silicon dioxide, barium sulfate, pumice powder, calcium carbonate, carbon black, talcum powder, and diamond powder.

Further, the functional adhesive layer is made up of any one or more selected from the group consisting of a polyurethane pressure-sensitive adhesive, a silica-gel pressure-sensitive adhesive, an acrylic pressure-sensitive adhesive, a natural rubber based pressure-sensitive adhesive, a synthetic rubber based pressure-sensitive adhesive, a thermosetting structural adhesive and a thermoplastic structural adhesive; curing agent in the functional adhesive layer is one or more selected from the group consisting of an epoxy curing agent, an isocyanate curing agent, an imidazole curing agent, an acylhydrazine curing agent and an amine curing agent;

tackifying resin in the functional adhesive layer is any one or more selected from the group consisting of rosin and rosin derivative resin series, terpene resin series, polymerization resin series and condensation resin series; antioxidant in the functional adhesive layer is any one or more selected from the group consisting of an aromatic amine antioxidant, a hindered phenol antioxidant and an auxiliary antioxidant; ultraviolet absorbent in the functional adhesive layer is any one or more selected from the group consisting of salicylate, benzophenones, benzotriazoles, substituted acrylonitriles, triazines and hindered amines or a composite thereof.

A manufacturing method of any of the above-mentioned high-performance repair tapes for a backboard of a photovoltaic module, comprising the following steps:

S1: any one or more raw materials selected from the group consisting of a polyurethane pressure-sensitive adhesive, a silica-gel pressure-sensitive adhesive, an acrylic pressure-sensitive adhesive, a natural rubber based pressure-sensitive adhesive, a synthetic rubber based pressure-sensitive adhesive, a thermosetting structural adhesive and a thermoplastic structural adhesive are taken, mixed and stirred uniformly with a solvent, so that a parent resin is obtained;

S2: the parent resin prepared in the step S1 is taken, and one or more curing agents selected from the group consisting of an epoxy curing agent, an isocyanate curing agent, an imidazole curing agent, an acylhydrazine curing agent and an amine curing agent are added; any one or more tackifying resins selected from the group consisting of rosin and rosin derivative resin series, terpene resin series, polymerization resin series and condensation resin series are added; any one or more antioxidants selected from the group consisting of an aromatic amine antioxidant, a hindered phenol antioxidant and an auxiliary antioxidant are added; any one or more ultraviolet absorbents selected from the group consisting of salicylates, benzophenones, benzotriazoles, substituted acrylonitriles, triazines and hindered amines or a composite thereof are added; and the mixture is mixed and stirred uniformly, so that an adhesive liquid mixture is obtained;

S3: the adhesive liquid mixture prepared in the step S2 is coated on a base material layer to obtain a functional adhesive layer with a dry adhesive thickness of 20 μm-150 μm, and the side of the base material layer coated with the adhesive liquid mixture is attached to a release material layer, cured at 30-80° C. for more than or equal to 24 hours.

Further, the base material layer is a coated polyester film, and the method comprises the following steps:

S1: the coating layer is coated on the core layer having a thickness of 25-250 μm, with the coating thickness being 2-50 μm;

S2: one or several compounds selected from the group consisting of methyl acrylate, isooctyl acrylate, acrylic acid and hydroxyethyl acrylate are taken and mixed with butyl acrylate uniformly; the mixture is added into a reaction container; an EAC solvent is added and an azobisisobutyronitrile initiator is added; then heating is conducted for a reaction under the condition of introducing nitrogen; after the reaction is finished, the resultant is diluted using the reaction solvent so as to adjust the solid content, then a synthetic glue is obtained;

S3: 100 parts of the synthetic glue prepared in the step S2 is taken, and 0.2-0.3 part of isocyanate curing agent L-75 or epoxy curing agent NX-100E, 20-25 parts of rosin resin PR-12603, hydrogenated rosin KS 2100 or petroleum resin FTR-6100, 0.03 part of antioxidant 1010 and 0.2 part of ultraviolet absorbent TINUVIN 326 are added; the mixture is diluted using ethyl acetate to a solid content of 20%; the resulting mixture is coated on the back face of the core layer coated with the coating layer in the base material layer, wherein the dry adhesive thickness is 45-55 μm, and then it is cured at 40-50° C. for 60-80 hours.

Further, the core layer has a thickness of 50 μm, and the coating layer has a thickness of 5 μm.

The method has the outstanding effects that:

1. According to the high-performance repair tape for a backboard of a photovoltaic module, and a manufacturing method thereof provided by the present invention, effects such as water resistance, insulation and ultraviolet radiation resistance can be achieved by selecting a weather-resistant base material layer, which functions as an independent backboard; by selecting a weather-resistant adhesive for the functional adhesive layer, the weather resistance, high-temperature resistance, and yellowing resistance of the tape can be improved; the tape has a strong bonding strength and is not easy to peel off, and the tape is easy to fit and facilitates construction.

2. According to the high-performance repair tape for a backboard of a photovoltaic module, and a manufacturing method thereof provided by the present invention, the formula of the acrylic pressure-sensitive adhesive used therein is different from that of the pressure-sensitive adhesive used for a positioning tape, which is mainly due to different uses of the two. The repair tape functions such that it is connected to a damaged backboard with a large initial adhesive force, that the adhesive force with the damaged backboard is maintained without foaming in various aging-resistant test processes, that the adhesive layer of the tape can fills the interspaces of the damaged backboard, and meanwhile that the tape has the characteristic of electrical insulation similar to that of the backboard of the solar module; while the pressure-sensitive adhesive used for the positioning tape functions such that it has certain adhesive force with an adhesive film and a cell initially, that the adhesive force is increased without foaming after hot pressing, and that the tape resists yellowing in the aging test process and does not bubble in a hot spot test.

3. According to the high-performance repair tape for a backboard of a photovoltaic module, and a manufacturing method thereof provided by the present invention, the coating layer is used in an environment where it is exposed in the air for a long time, and protects the base material layer from yellowing in various environments; whereas the fluorine coating layer of the positioning tape functions such that the bonding force between the fluorine coating layer and the adhesive film is large during the hot pressing of the module while the attenuation of the peel force after aging is extremely small. The fluorine coating layer is employed in the repair tape for the purpose of reducing the use of a release film and achieving superior performances and lower cost.

BRIEF DESCRIPTION OF THE DRAWINGS

In the FIGURE, reference number 1 represents a base material layer, reference number 2 represents a functional adhesive layer, and reference number 3 represents a release material layer.

DETAILED DESCRIPTION

The technical solutions in the examples of the present invention will be clearly and completely described below with reference to the drawings, and it is apparent that the described examples are only part, not all, of the examples of the present invention.

Example 1

Figure 1:
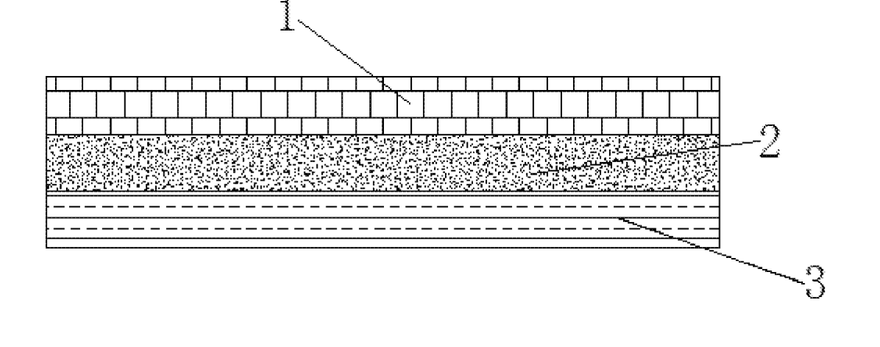
FIG. 1 is a structural view of Examples 1-14 of the present invention.

As shown in FIG. 1, the high-performance repair tape for a backboard of a photovoltaic module in this example comprises a base material layer 1, a functional adhesive layer 2 and a release material layer 3 disposed in sequence from top to bottom. The base material layer 1 is a 300 μm composite polyester film, comprising a core layer situated in the middle and weather-resistant polymer films adhered to two sides of the core layer, wherein the core layer is a polyester film, the weather-resistant polymer film is a fluorine film which is 50 μm polyvinylidene fluoride (PVDF) film. The functional adhesive layer 2 comprises acrylic pressure-sensitive adhesive, wherein the added curing agent is an epoxy curing agent, the added tackifying resin is rosin, the added antioxidant is an aromatic amine antioxidant, and the added ultraviolet absorbent is a salicylate ultraviolet absorbent.

A manufacturing method of any one of the above-mentioned high-performance repair tapes for a backboard of a photovoltaic module, comprising the following steps:
  S1: 100 g of acrylic pressure-sensitive adhesive with a solid content of 30% was taken, and mixed with 50 g of an organic solvent and stirred uniformly, so that a parent resin was obtained;
  S2: the parent resin prepared in the step S1 was taken, and 0.2 g of epoxy curing agent with a curing amount of 50% was added, the mixture was stirred for 5 min so that a mixed liquid was obtained; then 10 g of rosin tackifying resin was added, 1 g of aromatic amine antioxidant was added, and 0.5 g of salicylate ultraviolet absorbent was added, followed by stirring for 5 min, and then an adhesive liquid mixture was obtained;
  S3: the adhesive liquid mixture prepared in the step S2 was coated on the base material layer 1 with a dry adhesive thickness of 50 μm, and the side of the base material layer 1 coated with the adhesive liquid mixture was attached to the release material layer 3, cured at 60° C. for 72 hours.

Example 2

As shown in FIG. 1, the high-performance repair tape for a backboard of a photovoltaic module in this example comprises a base material layer 1, a functional adhesive layer 2 and a release material layer 3 disposed in sequence from top to bottom. The base material layer 1 is 250 μm composite polyester film, comprising a core layer situated in the middle, a weather-resistant polymer film adhered to one side of the core layer and a polymer weather-resistant coating layer adhered to the other side of the core layer, wherein the core layer is a nylon film, the weather-resistant polymer film is 50 μm ultraviolet-resistant polyolefine film, the polymer weather-resistant coating layer is formed by curing a fluorocarbon resin on the surface of the core layer using a curing agent. The functional adhesive layer 2 is made up of an acrylic pressure-sensitive adhesive and a thermosetting structural adhesive, wherein the added curing agents are an epoxy curing agent and an isocyanate curing agent, the added tackifying resin is a rosin derivative resin, the added antioxidant is a hindered phenol antioxidant, and the added ultraviolet absorbent is a benzophenone.

A manufacturing method of any one of the above-mentioned high-performance repair tapes for a backboard of a photovoltaic module, comprising the following steps:
  S1: 100 g of acrylic pressure-sensitive adhesive with a solid content of 30% and 10 g of thermosetting structural adhesive were taken, and mixed with 50 g of an organic solvent and stirred uniformly for 10 min, so that a parent resin was obtained;
  S2: the parent resin prepared in the step S1 was taken, 0.2 g of epoxy curing agent with a curing amount of 50% and 0.05 g of isocyanate curing agent were added, and the mixture was stirred for 5 min so that a mixed liquid was obtained; then 10 g of rosin derivative resin was added, 1 g of hindered phenol antioxidant was added, and 0.5 g of benzophenone ultraviolet absorbent was added, followed by stirring for 5 min, and then an adhesive liquid mixture was obtained;
  S3: the adhesive liquid mixture prepared in the step S2 was coated on the base material layer 1 with a dry adhesive thickness of 20 μm, and the side of the base material layer 1 coated with the adhesive liquid mixture was attached to the release material layer 3, cured at 80° C. for 24 hours.

Example 3

As shown in FIG. 1, the high-performance repair tape for a backboard of a photovoltaic module in this example comprises a base material layer 1, a functional adhesive layer 2 and a release material layer 3 disposed in sequence from top to bottom. The base material layer 1 is a coated polyester film, comprising a core layer positioned in the middle and a coating layer directly coated on two sides of the core layer; wherein the core layer is a high-barrier film, the coating layer comprises an organic resin, a curing agent and an inorganic filler; wherein the organic resin is a fluoro-silicone resin, the curing agent is an isocyanate curing agent, and the inorganic filler is titanium white powder. The functional adhesive layer 2 is a polyurethane pressure-sensitive adhesive, wherein the added curing agent is an imidazole curing agent, the added tackifying resin is a terpene resin, the added antioxidant is an auxiliary antioxidant, and the added ultraviolet absorbent is a benzotriazole ultraviolet absorbent.

A manufacturing method of any one of the above-mentioned high-performance repair tapes for a backboard of a photovoltaic module, comprising the following steps:
  S1: 100 g of polyurethane pressure-sensitive adhesive with a solid content of 30% was taken, and mixed with 50 g of an organic solvent and stirred uniformly for 10 min, so that a parent resin was obtained;
  S2: the parent resin prepared in the step S1 was taken, 0.1 g of imidazole curing agent with a curing amount of 50% was added, and the mixture was stirred for 5 min so that a mixed liquid was obtained; then 10 g of terpene resin was added, 1 g of auxiliary antioxidant was added, and 0.5 g of benzotriazole ultraviolet absorbent was added, followed by stirring for 5 min, and then an adhesive liquid mixture was obtained;

S3: the adhesive liquid mixture prepared in the step S2 was coated on the base material layer 1 with a dry adhesive thickness of 150 μm, and the side of the base material layer 1 coated with the adhesive liquid mixture was attached to the release material layer 3, cured at 30° C. for 96 hours.

Example 4

As shown in FIG. 1, the high-performance repair tape for a backboard of a photovoltaic module in this example comprises a base material layer 1, a functional adhesive layer 2 and a release material layer 3 disposed in sequence from top to bottom. The base material layer 1 is a coated polyester film, comprising a core layer positioned in the middle and a coating layer directly coated on one side of the core layer; wherein the core layer is a polypropylene film, the coating layer comprises an organic resin, a curing agent and an inorganic filler; wherein the organic resin is a polyvinylene difluoride fluorocarbon resin and a polytetrafluoroethylene fluorocarbon resin, the curing agent is an imidazole curing agent, and the inorganic filler is mica powder and talcum powder. The functional adhesive layer 2 is made up of a silica gel pressure-sensitive adhesive, wherein the added curing agent is an acylhydrazine curing agent, the added tackifying resin is a polymerization resin, the added antioxidant is an auxiliary antioxidant, and the added ultraviolet absorbent is a substituted acrylonitrile ultraviolet absorbent.

A manufacturing method of any one of the above-mentioned high-performance repair tapes for a backboard of a photovoltaic module, comprising the following steps:
S1: 100 g of silica gel pressure-sensitive adhesive with a solid content of 30% was taken, and mixed with 50 g of an organic solvent and stirred uniformly for 10 min, so that a parent resin was obtained;
S2: the parent resin prepared in the step S1 was taken, 0.1 g of acylhydrazine curing agent with a curing amount of 50% was added, and the mixture was stirred for 5 min so that a mixed liquid was obtained; then 10 g of polymerization resin was added, 1 g of auxiliary antioxidant was added, and 0.3 g of substituted acrylonitrile ultraviolet absorbent was added, followed by stirring for 5 min, and then an adhesive liquid mixture was obtained;
S3: the adhesive liquid mixture prepared in the step S2 was coated on the base material layer 1 with a dry adhesive thickness of 100 μm, and the side of the base material layer 1 coated with the adhesive liquid mixture was attached to the release material layer 3, cured at 60° C. for 72 hours.

Example 5

As shown in FIG. 1, the high-performance repair tape for a backboard of a photovoltaic module in this example comprises a base material layer 1, a functional adhesive layer 2 and a release material layer 3 disposed in sequence from top to bottom. The base material layer 1 is a polymer co-extruded resin film, specifically a multilayer co-extruded film made up of modified polyolefin materials, wherein the modified polyolefin materials are obtained by blending or dynamically crosslinking a polyolefin with a macromolecule graft copolymer containing an amide group, and simultaneously adding a filler diatomite for modification so as to enhance tensile-failure resistance, water resistance, easy adhesion and light reflection. The functional adhesive layer 2 comprises acrylic pressure-sensitive adhesive and butyl rubber, wherein the added curing agent is an amine curing agent, the added tackifying resin is a condensation resin, the added antioxidant is aromatic amine antioxidant, and the added ultraviolet absorbent is a triazine ultraviolet absorbent.

A manufacturing method of any one of the above-mentioned high-performance repair tapes for a backboard of a photovoltaic module, comprising the following steps:
S1: 50 g of acrylic pressure-sensitive adhesive with a solid content of 30% and 50 g of butyl rubber were taken, and mixed with 50 g of an organic solvent and stirred uniformly for 10 min, so that a parent resin was obtained;
S2: the parent resin prepared in the step S1 was taken, 0.1 g of amine curing agent with a curing amount of 50% was added, and the mixture was stirred for 5 min so that a mixed liquid was obtained; then 10 g of condensation resin was added, 1 g of auxiliary antioxidant was added, and 0.3 g of triazine ultraviolet absorbent was added, followed by stirring for 5 min, and then an adhesive liquid mixture was obtained;
S3: the adhesive liquid mixture prepared in the step S2 was coated on the base material layer 1 with a dry adhesive thickness of 100 μm, and the side of the base material layer 1 coated with the adhesive liquid mixture was attached to the release material layer 3, cured at 60° C. for 72 hours.

Example 6

As shown in FIG. 1, the high-performance repair tape for a backboard of a photovoltaic module in this example comprises a base material layer 1, a functional adhesive layer 2 and a release material layer 3 disposed in sequence from top to bottom. The base material layer 1 is a polymer co-extruded resin film, specifically a multilayer co-extruded film made up of modified polyolefin materials, wherein the modified polyolefin materials are obtained by blending or dynamically crosslinking a polyolefin with a macromolecule graft copolymer containing an epoxy group, and simultaneously adding a filler aluminum oxide for modification so as to enhance tensile-failure resistance, water resistance, easy adhesion and light reflection. The functional adhesive layer 2 comprises acrylic pressure-sensitive adhesive and butyl rubber, wherein the added curing agent is an amine curing agent, the added tackifying resin is a condensation resin, the added antioxidant is an aromatic amine antioxidant, and the added ultraviolet absorbent is a triazine ultraviolet absorbent.

A manufacturing method of any one of the above-mentioned high-performance repair tapes for a backboard of a photovoltaic module, comprising the following steps:
S1: 50 g of acrylic pressure-sensitive adhesive with a solid content of 30% and 50 g of butyl rubber were taken, and mixed with 50 g of an organic solvent and stirred uniformly for 10 min. so that a parent resin was obtained;
S2: the parent resin prepared in the step S1 was taken, 0.1 g of amine curing agent with a curing amount of 50% was added, and the mixture was stirred for 5 min so that a mixed liquid was obtained; then 10 g of condensation resin was added, 1 g of auxiliary antioxidant was added, and 0.3 g of triazine ultraviolet absorbent was added, followed by stirring for 5 min, and then an adhesive liquid mixture was obtained;

S3: the adhesive liquid mixture prepared in the step S2 was coated on the base material layer 1 with a dry adhesive thickness of 100 m, and the side of the base material layer 1 coated with the adhesive liquid mixture was attached to the release material layer 3, cured at 60° C. for 72 hours.

Example 7

As shown in FIG. 1, the high-performance repair tape for a backboard of a photovoltaic module in this example comprises a base material layer 1, a functional adhesive layer 2 and a release material layer 3 disposed in sequence from top to bottom. The base material layer 1 is a polymer co-extruded resin film, specifically a multilayer co-extruded film made up of modified polyolefin materials, wherein the modified polyolefin materials are obtained by blending or dynamically crosslinking a polyolefin with a macromolecule graft copolymer containing a maleic anhydride group, and simultaneously adding a filler mica powder for modification so as to enhance tensile-failure resistance, water resistance, easy adhesion and light reflection. The functional adhesive layer 2 comprises acrylic pressure-sensitive adhesive and butyl rubber, wherein the added curing agent is an amine curing agent, the added tackifying resin is a condensation resin, the added antioxidant is aromatic amine antioxidant, and the added ultraviolet absorbent is a triazine ultraviolet absorbent.

A manufacturing method of any one of the above-mentioned high-performance repair tapes for a backboard of a photovoltaic module, comprising the following steps:
  S1: 50 g of acrylic pressure-sensitive adhesive with a solid content of 30% and 50 g of butyl rubber were taken, and mixed with 50 g of an organic solvent and stirred uniformly for 10 min, so that a parent resin was obtained;
  S2: the parent resin prepared in the step S1 was taken, 0.1 g of amine curing agent with a curing amount of 50% was added, and the mixture was stirred for 5 min so that a mixed liquid was obtained; then 10 g of condensation resin was added, 1 g of auxiliary antioxidant was added, and 0.3 g of triazine ultraviolet absorbent was added, followed by stirring for 5 min, and then an adhesive liquid mixture was obtained;
  S3: the adhesive liquid mixture prepared in the step S2 was coated on the base material layer 1 with a dry adhesive thickness of 100 μm, and the side of the base material layer 1 coated with the adhesive liquid mixture was attached to the release material layer 3, cured at 60° C. for 72 hours.

Example 8

As shown in FIG. 1, the high-performance repair tape for a backboard of a photovoltaic module in this example comprises a base material layer 1, a functional adhesive layer 2 and a release material layer 3 disposed in sequence from top to bottom. The base material layer 1 is a polymer co-extruded resin film, specifically a multilayer co-extruded film made up of modified polyolefin materials, wherein the modified polyolefin materials are obtained by blending or dynamically crosslinking a polyolefin with a macromolecule graft copolymer containing a polyether group, and simultaneously adding a filler carbon black and talcum powder for modification so as to enhance tensile-failure resistance, water resistance, easy adhesion and light reflection. The functional adhesive layer 2 comprises an acrylic pressure-sensitive adhesive and butyl rubber, wherein the added curing agent is an amine curing agent, the added tackifying resin is a condensation resin, the added antioxidant is an aromatic amine antioxidant, and the added ultraviolet absorbent is a composite ultraviolet absorbent of triazine and hindered amine.

A manufacturing method of any one of the above-mentioned high-performance repair tapes for a backboard of a photovoltaic module, comprising the following steps:
  S1: 50 g of acrylic pressure-sensitive adhesive with a solid content of 30% and 50 g of butyl rubber were taken, and mixed with 50 g of an organic solvent and stirred uniformly for 10 min, so that a parent resin was obtained;
  S2: the parent resin prepared in the step S1 was taken, 0.1 g of amine curing agent with a curing amount of 50% was added, and the mixture was stirred for 5 min so that a mixed liquid was obtained; then 10 g of condensation resin was added, 1 g of auxiliary antioxidant was added, and 0.3 g of triazine ultraviolet absorbent was added, followed by stirring for 5 min, and then an adhesive liquid mixture was obtained;
  S3: the adhesive liquid mixture prepared in the step S2 was coated on the base material layer 1 with a dry adhesive thickness of 100 μm, and the side of the base material layer 1 coated with the adhesive liquid mixture was attached to the release material layer 3, cured at 60° C. for 72 hours.

Example 9

As shown in FIG. 1, the high-performance repair tape for a backboard of a photovoltaic module in this example comprises a base material layer 1, a functional adhesive layer 2 and a release material layer 3 disposed in sequence from top to bottom. The base material layer 1 is a composite polyester film, comprising a core layer situated in the middle, a weather-resistant polymer film adhered to one side of the core layer and a polymer weather-resistant coating layer adhered to the other side of the core layer; wherein the core layer is a polyethylene film, the weather-resistant polymer film is an ultraviolet-resistant polyester film, and the polymer weather-resistant coating layer is formed by directly curtain coating an acrylic resin onto the surface of the core layer. The functional adhesive layer 2 is made up of a natural-rubber pressure-sensitive adhesive and a thermoplastic structural adhesive, wherein the added curing agents are an epoxy curing agent and an isocyanate curing agent, the added tackifying resin is a rosin derivative resin, the added antioxidant is a hindered phenol antioxidant, and the added ultraviolet absorbent is a benzophenone.

A manufacturing method of any and of the above-mentioned high-performance repair tapes for a backboard of a photovoltaic module, comprising the following steps:
  S1: 100 g of natural rubber pressure-sensitive adhesive with a solid content of 30% and 10 g of thermoplastic structural adhesive were taken, and mixed with 50 g of an organic solvent and stirred uniformly for 10 min, so that a parent resin was obtained;
  S2: the parent resin prepared in the step S1 was taken, 0.2 g of epoxy curing agent with a curing amount of 50% and 0.05 g of isocyanate curing agent were added, and the mixture was stirred for 5 min so that a mixed liquid was obtained; then 10 g of rosin derivative resin was added, 1 g of hindered phenol antioxidant was added, and 0.5 g of benzophenone ultraviolet absorbent was added, followed by stirring for 5 min, and then an adhesive liquid mixture was obtained;

S3: the adhesive liquid mixture prepared in the step S2 was coated on the base material layer 1 with a dry adhesive thickness of 20 μm, and the side of the base material layer 1 coated with the adhesive liquid mixture was attached to the release material layer 3, cured at 80° C. for 24 hours.

Example 10

As shown in FIG. 1, the high-performance repair tape for a backboard of a photovoltaic module in this example comprises a base material layer 1, a functional adhesive layer 2 and a release material layer 3 disposed in sequence from top to bottom. The base material layer 1 is a coated polyester film, comprising a core layer positioned in the middle and a coating layer directly coated on one side of the core layer; wherein the core layer is a polyester film, and the coating layer comprises an organic resin, a curing agent and an inorganic filler; wherein the organic resin is a composition of a fluoro-silicone resin and a polyvinylene difluoride fluorocarbon resin in a weight ratio of 1:1, the curing agent is a composition of an isocyanate curing agent and an imidazole curing agent in a weight ratio of 1:3, and the inorganic filler is a mixture of titanium white powder, mica and aluminum oxide in a weight ratio of 1:2:3. The functional adhesive layer 2 is made up of a silica gel pressure-sensitive adhesive, wherein the added curing agent is an acylhydrazine curing agent, the added tackifying resin is a polymerization resin, the added antioxidant is an auxiliary antioxidant, and the added ultraviolet absorbent is a substituted acrylonitrile ultraviolet absorbent.

A manufacturing method of any one of the above-mentioned high-performance repair tapes for a backboard of a photovoltaic module, comprising the following steps:

S1: the coating layer was coated on the core layer having a thickness of 25 μm, with the coating thickness being 2 μm;

S2: 20 parts of methyl acrylate, 25.5 parts of isooctyl acrylate, 4 parts of acrylic acid, 0.5 part of hydroxyethyl acrylate and 50 parts of butyl acrylate were added into a reaction device provided with a stirrer, a reflux condenser tube and a nitrogen introduction tube, 100 parts of ECA solvent was added therein, nitrogen was introduced, and the mixture was stirred for half an hour, warmed up slowly to 70° C.; and then 0.2 part of azodiisobutyronitrile was added, and a reaction was performed for 5 hours under the protection of nitrogen, and finally the mixture was adjusted by using the (ECA solvent to obtain a synthetic glue with a solid content of 40%;

S3: 100 parts of the synthetic glue prepared in the step S2 was taken, 0.2 part of isocyanate curing agent L-75 (Bayer) was added, 20 parts of rosin resin PR-12603 (Sumitomo) was added, and 0.03 part of antioxidant 1010 and 0.2 part of ultraviolet absorbent TINUVIN 326 were added; and the resulting mixture was diluted by ethyl acetate to a solid content of 20%, and coated on the back face of the core layer coated with the coating layer in the base material layer, with the dry adhesive thickness being 50 μm, followed by curing at 45° C. for 72 hours.

Example 11

As shown in FIG. 1, the high-performance repair tape for a backboard of a photovoltaic module in this example comprises a base material layer 1, a functional adhesive layer 2 and a release material layer 3 disposed in sequence from top to bottom. The base material layer 1 is a coated polyester film, comprising a core layer positioned in the middle and a coating layer directly coated on one side of the core layer; wherein the core layer is a nylon film, and the coating layer comprises an organic resin, a curing agent and an inorganic filler; wherein the organic resin is a polytetrafluoroethylene fluorocarbon resin, the curing agent is a composition of an isocyanate curing agent, an imidazole curing agent and a dicyandiamide curing agent in a weight ratio of 1:2:3, and the inorganic filler is a mixture of silicon dioxide, barium sulfate and pumice powder in a weight ratio of 2:2:5. The functional adhesive layer 2 is made up of a silica gel pressure-sensitive adhesive, wherein the added curing agent is an acylhydrazine curing agent, the added tackifying resin is a polymerization resin, the added antioxidant is an auxiliary antioxidant, and the added ultraviolet absorbent is a substituted acrylonitrile ultraviolet absorbent.

A manufacturing method of any one of the above-mentioned high-performance repair tapes for a backboard of a photovoltaic module, comprising the following steps:

S1: the coating layer was coated on the core layer having a thickness of 50 μm, with the coating thickness being 5 μm;

S2: 20 parts of methyl acrylate, 25.5 parts of isooctyl acrylate, 4 parts of acrylic acid, 0.5 part of hydroxyethyl acrylate and 50 parts of butyl acrylate were added into a reaction device provided with a stirrer, a reflux condenser tube and a nitrogen introduction tube, 100 parts of ECA solvent was added therein, nitrogen was introduced, and the mixture was stirred for half an hour, warmed up slowly to 70° C.; and then 0.2 part of azodiisobutyronitrile was added, and a reaction was performed for 5 hours under the protection of nitrogen, and finally the mixture was adjusted by using the ECA solvent to obtain a synthetic glue with a solid content of 40%;

S3: 100 parts of the synthetic glue prepared in the step S2 was taken, 0.2 part of epoxy curing agent NX-100E (Soken Chemical & Engineering Co., Ltd, Japan) was added, 20 parts of rosin resin PR-12603 (Sumitomo) was added, and 0.03 part of antioxidant 1010 and 0.2 part of ultraviolet absorbent TINUVIN 326 were added; the resulting mixture was diluted by ethyl acetate to a solid content of 20%, and coated on the back face of the core layer coated with the coating layer in the base material layer, with the dry adhesive thickness being 45 μm, followed by curing at 40° C. for 80 hours.

Example 12

As shown in FIG. 1, the high-performance repair tape for a backboard of a photovoltaic module in this example comprises a base material layer 1, a functional adhesive layer 2 and a release material layer 3 disposed in sequence from top to bottom. The base material layer 1 is a coated polyester film, comprising a core layer positioned in the middle and a coating layer directly coated on one side of the core layer; wherein the core layer is a high-barrier film, and the coating layer comprises an organic resin, a curing agent and an inorganic filler; wherein the organic resin is a perfluorinated resin, the curing agent is a composition of an isocyanate curing agent, an imidazole curing agent and a dicyandiamide curing agent in a weight ratio of 2:2:2, and the inorganic filler is a mixture of calcium carbonate, carbon black and talcum powder in a weight ratio of 2:2:5. The functional adhesive layer 2 is made up of a silica gel pressure-sensitive adhesive, wherein the added curing agent is an acylhydrazine curing agent, the added tackifying resin is a polymerization resin, the added antioxidant is an auxiliary antioxidant, and the added ultraviolet absorbent is a substituted acrylonitrile ultraviolet absorbent.

A manufacturing method of any of the above-mentioned high-performance repair tapes for a backboard of a photovoltaic module, comprising the following steps:

S1: the coating layer was coated on the core layer having a thickness of 100 μm, with the coating thickness being 10 μm;

S2: 20 parts of methyl acrylate, 25.5 parts of isooctyl acrylate, 4 parts of acrylic acid, 0.5 part of hydroxyethyl acrylate and 50 parts of butyl acrylate were added into a reaction device provided with a stirrer, a reflux condenser tube and a nitrogen introduction tube, 100 parts of ECA solvent was added therein, nitrogen was introduced, and the mixture was stirred for half an hour, warmed up slowly to 70° C.; and then 0.2 part of azodiisobutyronitrile was added, and a reaction was performed for 5 hours under the protection of nitrogen, and finally the mixture was adjusted by using the ECA solvent to obtain a synthetic glue with a solid content of 40%;

S3: 100 parts of the synthetic glue prepared in the step S2 was taken, 0.2 part of isocyanate curing agent L-75 (Bayer) was added, 20 parts of petroleum resin FTR-6100 (Mitsui) was added, and 0.03 part of antioxidant 1010 and 0.2 part of ultraviolet absorbent TINUVIN 326 were added; the resulting mixture was diluted by ethyl acetate to a solid content of 20%, and coated on the back face of the core layer coated with the coating layer in the base material layer, with the dry adhesive thickness being 55 μm, followed by curing at 50° C. for 60 hours.

Example 13

As shown in FIG. 1, the high-performance repair tape for a backboard of a photovoltaic module in this example comprises a base material layer 1, a functional adhesive layer 2 and a release material layer 3 disposed in sequence from top to bottom. The base material layer 1 is a coated polyester film, comprising a core layer positioned in the middle and a coating layer directly coated on one side of the core layer; wherein the core layer is a polypropylene film, the coating layer comprises an organic resin, a curing agent and an inorganic filler; wherein the organic resin is a perfluorinated resin, a fluorine-containing acrylic resin and a fluoro-silicone resin in a weight ratio of 4:2:3, the curing agent is a composition of an imidazole curing agent and a dicyandiamide curing agent in a weight ratio of 1:2, and the inorganic filler is a mixture of diatomite and diamond powder in a weight ratio of 1:1. The functional adhesive layer 2 is made up of a silica gel pressure-sensitive adhesive, wherein the added curing agent is an acylhydrazine curing agent, the added tackifying resin is a polymerization resin, the added antioxidant is an auxiliary antioxidant, and the added ultraviolet absorbent is a substituted acrylonitrile ultraviolet absorbent.

A manufacturing method of any one of the above-mentioned high-performance repair tapes for a backboard of a photovoltaic module, comprising the following steps:

S1: the coating layer was coated on the core layer having a thickness of 150 μm, with the coating thickness being 20 μm;

S2: 20 parts of methyl acrylate, 25.5 parts of isooctyl acrylate, 4 parts of acrylic acid, 0.5 part of hydroxyethyl acrylate and 50 parts of butyl acrylate were added into a reaction device provided with a stirrer, a reflux condenser tube and a nitrogen introduction tube, 100 parts of ECA solvent was added therein, nitrogen was introduced, and the mixture was stirred for half an hour, warmed up slowly to 70° C.; and then 0.2 part of azodiisobutyronitrile was added, and a reaction was performed for 5 hours under the protection of nitrogen, and finally the mixture was adjusted by using the ECA solvent to obtain a synthetic glue with a solid content of 40%;

S3: 100 parts of the synthetic glue prepared in the step S2 was taken, 0.3 part of epoxy curing agent NX-100E (Soken Chemical & Engineering Co., Ltd, Japan) was added, 30 parts of hydrogenated rosin KS 2100 (Komo) was added, and 0.03 part of antioxidant 1010 and 0.2 part of ultraviolet absorbent TINUVIN 326 were added; the resulting mixture was diluted by ethyl acetate to a solid content of 20%, and coated on the back face of the core layer coated with the coating layer in the base material layer, with the dry adhesive thickness being 45 μm, followed by curing at 40° C. for 72 hours.

Example 14

As shown in FIG. 1, the high-performance repair tape for a backboard of a photovoltaic module in this example comprises a base material layer 1, a functional adhesive layer 2 and a release material layer 3 disposed in sequence from top to bottom. The base material layer 1 is a coated polyester film, comprising a core layer positioned in the middle and a coating layer directly coated on one side of the core layer; wherein the core layer is a polyethylene film, and the coating layer comprises an organic resin, a curing agent and an inorganic filler; wherein the organic resin is a fluorine-containing acrylic resin, the curing agent is an isocyanate curing agent, and the inorganic filler is titanium white powder. The functional adhesive layer 2 is made up of a silica gel pressure-sensitive adhesive, wherein the added curing agent is an acylhydrazine curing agent, the added tackifying resin is a polymerization resin, the added antioxidant is an auxiliary antioxidant, and the added ultraviolet absorbent is a substituted acrylonitrile ultraviolet absorbent.

A manufacturing method of any one of the above-mentioned high-performance repair tapes for a backboard of a photovoltaic module, comprising the following steps:

S1: the coating layer was coated on the core layer having a thickness of 250 μm, with the coating thickness being 50 μm;

S2: 20 parts of methyl acrylate, 25.5 parts of isooctyl acrylate, 4 parts of acrylic acid, 0.5 part of hydroxyethyl acrylate and 50 parts of butyl acrylate were added into a reaction device provided with a stirrer, a reflux condenser tube and a nitrogen introduction tube, 100 parts of ECA solvent was added therein, nitrogen was introduced, and the mixture was stirred for half an hour, warmed up slowly to 70° C.; and then 0.2 part of azodiisobutyronitrile was added, and a reaction was performed for 5 hours under the protection of nitrogen, and finally the mixture was adjusted by using the ECA solvent to obtain a synthetic glue with a solid content of 40%;

S3: 100 parts of the synthetic glue prepared in the step S2 was taken, 0.2 part of epoxy curing agent NX-100E (Soken Chemical & Engineering Co., Ltd, Japan) was added, 20 parts of rosin resin PR-12603 (Sumitomo) was added, and 0.03 part of antioxidant 1010 and 0.2 part of ultraviolet absorbent TINUVIN 326 were added; and the resulting mixture was diluted by ethyl acetate to a solid content of 20%, and coated on the back face of the core layer coated with the coating layer in the base material layer, with the dry adhesive thickness being 45 μm, followed by curing at 40° C. for 72 hours.

Test Examples

The effects of the present invention can be proved by the following tests:

Performance tests on the high-performance repair tape for a backboard of a photovoltaic module of the present invention are as follows.

1. Samples

They are self-manufactured according to Examples 1-14.

2. Test Methods 2.1 Test of 180° Peel Force of Samples by Peel Force Tester
  (1) A sample in a roll form or a sheet form was taken, and was first cut into 3-5 strips with a size of 25 mm×300 mm.
  (2) Mirror steel plate: the mirror steel plate has a length of 150±1 mm, a width of 50±1 mm and a thickness of 1.5 mm-2 mm.
  (3) Single-sided tape: the release material on the adhesive tape was tore off, wherein the adhesive surface cannot contact hands or other articles; the adhesive surface was connected with one end of the mirror steel plate, and was placed into full contact with the mirror steel plate by pressing back and forth at a speed of 300 mm/min for 3 times using a press roller (2 Kg) without application of external pressure, wherein bubbles were not allowed to be generated where the sample was bonded to the mirror steel plate.
  (4) After the test samples were prepared, they were kept to stand in a specified test environment for 20 min before testing.
  (5) The free end of the test sample was folded in half by 180°, and the binding surface was peeled off from the test plate by 25 mm; then the free end of the sample and the sample plate were clamped on an upper holder and a lower holder respectively, with the peeled surface being kept consistent with the force line of the tester; the peeling was conducted by the tester continuously at a rising speed of 300 mm/min±10 mm/min, and a peeling curve was drawn by an automatic recorder.
  (6) Test data and positions of damaged interfaces were recorded and average values were taken.

2.2 Test of 180° Peel Force of Samples by Peel Force Tester after Aging
  (1) The manufacturing method of test samples was consistent with the above.
  (2) the test samples, after well attached to the mirror steel plate, were placed in an environment with high temperature of 85±2° C. and high humidity of 85±5% R.H. for 2000 hours at TC (−40-85° C., 6H/cycle, 200 cycles), then removed and kept to stand for 2 h, and tested by using the aforementioned peel force test method.
  (3) Test data and positions of damaged interfaces were recorded and average values were taken.

2.3 Method for Yellowing Test
  (1) The tape was cut into samples with a size of 50 mm×150 mm (with fluorine coated side up), and the b value was measured with a color difference meter and recorded as b1.
  (2) The samples were placed in a QUV ultraviolet weathering tester (with fluorine coated side up), irradiated with UV 100 KWh, then removed and the b value was measured again with the color difference meter and recorded as b2.
  (3) Δb=b2−b1 was calculated.

2.4 Insulation Test Method for Adhesive Tapes
  (1) The tape prepared as above was used to repair and fit the cracked portion of the backboard of modules according to the construction method, wherein the modules have an area of 1.94 m².
  (2) Simultaneously, the repaired modules were respectively placed in an environment with high temperature of 85±2° C. and high humidity of 85±5% R.H. for 2000 hours at TC (−40-85° C., 6H/cycle, 200 cycles), then removed and kept to stand for 2 h.
  (3) The aged modules was immersed in water, supplied with 1000V and an insulation resistance measuring instrument at a limited current IC voltage source, maintained at this voltage for 120 s, and then measured to read the insulation resistance.

3. Test Results

The test results are shown in Table 1, and suggest that the high-performance repair tapes for a backboard of a photovoltaic module of the present invention have good adhesive property, weather resistance and yellowing resistance.

TABLE 1

Test results of performances of the repair tape for photovoltaic module of the present invention

| Groups | Peel force N/25 mm (at normal temperature for 20 min) | Peel force N/25 mm (double 85/2000 h) | Peel force N/25 mm (TC 200) | Yellowing Δb | Insulation resistance MΩ (double 85/2000 h) | Insulation resistance MΩ (TC 200) |
|---|---|---|---|---|---|---|
| Example 1 | 7.4 | 8.1 | 8.5 | 0.2 | 219 | 196 |
| Example 2 | 8.2 | 9.3 | 9.1 | 0.3 | 198 | 278 |
| Example 3 | 6.9 | 8.7 | 7.9 | 0.2 | 165 | 195 |
| Example 4 | 7.7 | 9.1 | 8.4 | 0.2 | 213 | 128 |
| Example 5 | 7.4 | 8.9 | 8.5 | 0.2 | 195 | 174 |

TABLE 1-continued

Test results of performances of the repair tape for photovoltaic module of the present invention

| Groups | Peel force N/25 mm (at normal temperature for 20 min) | Peel force N/25 mm (double 85/2000 h) | Peel force N/25 mm (TC 200) | Yellowing Δb | Insulation resistance MΩ (double 85/2000 h) | Insulation resistance MΩ (TC 200) |
|---|---|---|---|---|---|---|
| Example 6 | 7.0 | 8.1 | 9.2 | 0.2 | 165 | 193 |
| Example 7 | 8.2 | 9.6 | 7.9 | 0.3 | 297 | 278 |
| Example 8 | 6.9 | 8.7 | 8.4 | 0.2 | 186 | 195 |
| Example 9 | 7.4 | 8.1 | 8.8 | 0.2 | 215 | 197 |
| Example 10 | 8.2 | 9.0 | 9.1 | 0.3 | 198 | 278 |
| Example 11 | 6.9 | 8.9 | 7.9 | 0.2 | 165 | 198 |
| Example 12 | 7.6 | 9.1 | 8.4 | 0.2 | 277 | 123 |
| Example 13 | 7.4 | 8.9 | 8.6 | 0.2 | 186 | 175 |
| Example 14 | 8.0 | 8.8 | 9.3 | 0.2 | 175 | 199 |

The above are only preferred embodiments of the present invention and the scope of the present invention is not limited thereto. Any equivalent substitutions or modifications, made by those skilled people who are familiar with the art of the present invention within the technical scope disclosed by the present invention according to the technical solutions and inventive concepts of the present invention, are intended to be included in the scope of the present invention.

What is claimed is:

1. A high-performance repair tape for a backboard of a photovoltaic module, comprising a base material layer, a functional adhesive layer, and a release material layer provided in sequence from top to bottom, wherein the base material layer is made up of a polyester film material, and the functional adhesive layer is made up of a high weather-resistance adhesive;

wherein the functional adhesive layer is made up of any one or more selected from the group consisting of a polyurethane pressure-sensitive adhesive, a silica-gel pressure-sensitive adhesive, an acrylic acid pressure-sensitive adhesive, a natural rubber based pressure-sensitive adhesive, a thermosetting structural adhesive and a thermoplastic structural adhesive; curing agent in the functional adhesive layer is one or more selected from the group consisting of an epoxy curing agent, an isocyanate curing agent, an acylhydrazine curing agent and an amine curing agent; tackifying resin in the functional adhesive layer is any one or more selected from the group consisting of rosin and rosin derivative resin series, terpene resin series, polymerization resin series and condensation resin series; antioxidant in the functional adhesive layer is any one or more selected from the group consisting of an aromatic amine antioxidant, and an auxiliary antioxidant; ultraviolet absorbent in the functional adhesive layer is any one or more selected from the group consisting of salicylates, substituted acrylonitriles, triazines and hindered amines or a composite thereof;

wherein the base material layer is a polymer co-extruded resin film;

wherein the polymer co-extruded resin film is a multilayer co-extruded film made up of modified polyolefin materials, wherein the modified polyolefin materials are obtained by blending or dynamically crosslinking a polyolefin with a macromolecule graft copolymer containing an amide group, an epoxy group, a maleic anhydride group or a polyether group, and simultaneously adding a filler for modification so as to enhance tensile-failure resistance, water resistance, easy adhesion and light reflection; the filler is one or more selected from the group consisting of diatomite, aluminum oxide, aluminum hydroxide, titanium white powder, mica powder, silicon dioxide, barium sulfate, pumice powder, calcium carbonate, carbon black, talcum powder, and diamond powder.

2. A manufacturing method the high-performance repair tape for a backboard of a photovoltaic module according to claim 1, comprising the following steps:

Step 1: selecting any one or more raw materials from the group consisting of the polyurethane pressure-sensitive adhesive, the silica-gel pressure-sensitive adhesive, the acrylic acid pressure-sensitive adhesive, the natural rubber based pressure-sensitive adhesive, the synthetic rubber based pressure-sensitive adhesive, the thermosetting structural adhesive and the thermoplastic structural adhesive are taken, providing a solvent and mixing and stirring uniformly the one or more raw materials with the solvent, so that a parent resin is obtained;

Step 2: mixing and stirring uniformly the following materials with the parent resin prepared in the step 2:

the one or more curing agents selected from the group consisting of the epoxy curing agent, the isocyanate curing agent, the acylhydrazine curing agent and the amine curing agent is added;

the one or more tackifying resins selected from the group consisting of the rosin and rosin derivative series, the terpene resin series, the polymerization resin series and the condensation resin series; is added;

the one or more antioxidants selected from the group consisting of the aromatic amine antioxidant, the hindered phenol antioxidant and the auxiliary antioxidant; is added;

one or more ultraviolet absorbents selected from the group consisting of the salicylic acid esters, the benzophenones, the benzotriazoles, the substituted acrylonitriles, the triazines and the hindered amines or compounds thereof is added, so that an adhesive liquid mixture is obtained;

Step 3: coating the adhesive liquid mixture prepared in the step 2 on the base material layer to obtain a functional adhesive layer with a dry adhesive thickness of 20 μm-150 μm, and the side of the base material layer coated with the adhesive liquid mixture is attached to a release material layer, cured at 30-80° C. for more than or equal to 24 hours.

* * * * *